United States Patent
Hofmann et al.

(10) Patent No.: US 9,365,340 B2
(45) Date of Patent: Jun. 14, 2016

(54) DEVICE FOR RECEIVING AN ELECTRONIC DEVICE, IN PARTICULAR FOR USE IN AN EXPLOSION-PRONE AREA

(71) Applicant: ECOM Instruments GmbH, Assamstadt (DE)

(72) Inventors: Dieter Hofmann, Lauda-Koenigshofen (DE); Werner Gebert, Bad Mergentheim (DE); Dieter Roessler, Forchtenberg-Ernsbach (DE)

(73) Assignee: ECOM Instruments GmbH (DE)

( * ) Notice: Subject to any disclaimer, the term of this patent is extended or adjusted under 35 U.S.C. 154(b) by 0 days.

(21) Appl. No.: 14/672,064

(22) Filed: Mar. 27, 2015

(65) Prior Publication Data
US 2015/0274394 A1    Oct. 1, 2015

(30) Foreign Application Priority Data
Mar. 28, 2014   (DE) .......................... 10 2014 205 879

(51) Int. Cl.
*H02G 3/14* (2006.01)
*B65D 81/02* (2006.01)
*G06F 1/16* (2006.01)
*H05K 5/06* (2006.01)

(52) U.S. Cl.
CPC ............... *B65D 81/022* (2013.01); *G06F 1/16* (2013.01); *H05K 5/068* (2013.01)

(58) Field of Classification Search
CPC .............................. H04M 1/18; H04M 1/185
USPC .......... 206/320; 220/4.02, 3.7, 3.8, 3.9, 3.92, 220/721, 720; 174/560, 559; 455/575.1
See application file for complete search history.

(56) References Cited

U.S. PATENT DOCUMENTS

| | | | | |
|---|---|---|---|---|
| 5,497,290 A | * | 3/1996 | Fukui ................... | H05K 5/068 174/562 |
| 2013/0193149 A1 | * | 8/2013 | Balourdet ............. | A45F 5/00 220/560.01 |
| 2015/0271308 A1 | * | 9/2015 | Roessler ............ | H04M 1/0202 455/575.8 |

FOREIGN PATENT DOCUMENTS

| DE | 202004006679 U1 | 6/2004 |
|---|---|---|
| DE | 102011118571 A1 | 5/2013 |

OTHER PUBLICATIONS

German Search Report for FE-102014205879.1, mailed Dec. 12, 2014.
English abstract for DE-202004006679-U1.
English abstract for DE-102011118571-A1.

* cited by examiner

*Primary Examiner* — King M Chu
(74) *Attorney, Agent, or Firm* — Fishman Stewart PLLC

(57) ABSTRACT

A device arrangement for receiving an electronic device may include a casing enclosing at least partially a casing interior. A resilient partition wall may be disposed in the casing and divide the casing interior into a first sub-chamber and a second sub-chamber fluidically separated from the first sub-chamber. The first sub-chamber may be configured to receive the electronic device. The first sub-chamber may include a first gas at a pre-determined gas pressure and the second sub-chamber may include a second gas having a second gas pressure. A pressurizing device may be disposed in the casing interior and be configured to increase the pre-determined gas pressure of the first sub-chamber by a pre-determined amount in relation to the second gas pressure in the second sub-chamber. The second sub-chamber may communicate fluidically with a surrounding environment of the casing.

20 Claims, 1 Drawing Sheet

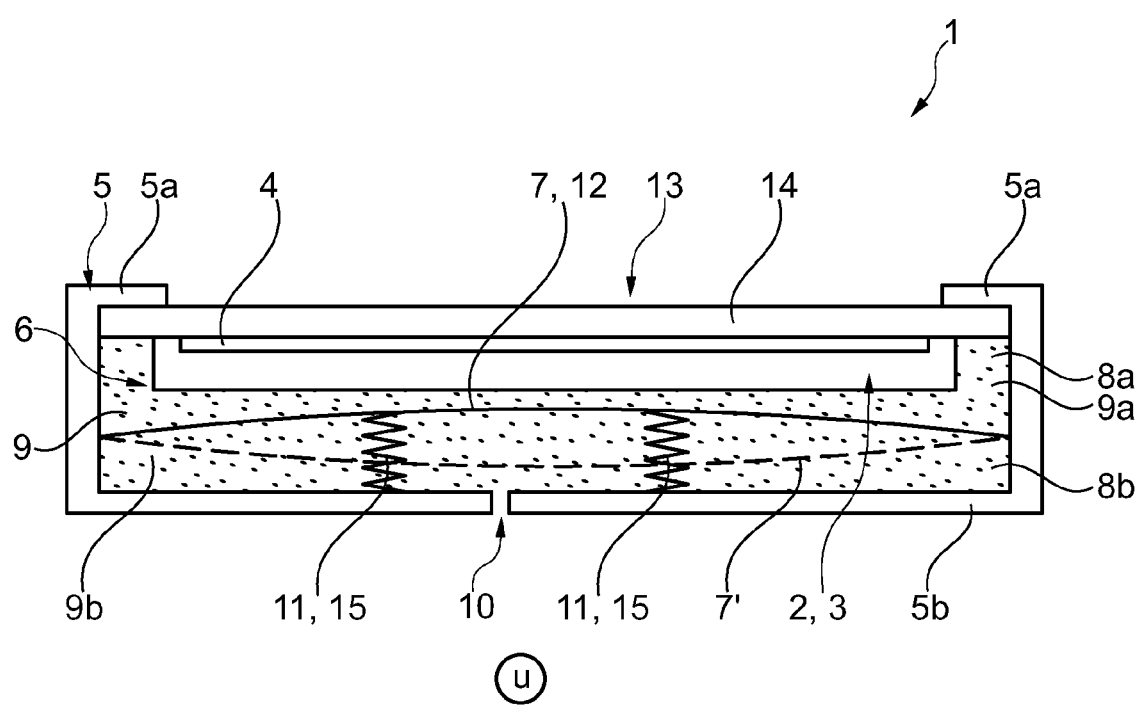

DEVICE FOR RECEIVING AN ELECTRONIC DEVICE, IN PARTICULAR FOR USE IN AN EXPLOSION-PRONE AREA

CROSS-REFERENCE TO RELATED APPLICATIONS

This application claims priority to German Patent Application No. 10 2014 205 879.1, filed Mar. 28, 2014, the contents of which are hereby incorporated by reference in their entirety.

TECHNICAL FIELD

The invention relates to a device for receiving an electronic device, in particular for use in an explosion-prone area.

BACKGROUND

In explosion-prone areas, for example, on drilling rigs, the electrical energies present at the external electronic interfaces of an electronic device can ignite a gas-air mixture present in the surroundings and cause an explosion. This applies particularly to highly reactive gas mixtures such as possibly mixtures of hydrogen and oxygen, for which said energy is available as activation energy in order to initiate an exothermic reaction of hydrogen and oxygen to give water. The same applies to gas mixtures of acetylene-oxygen.

Furthermore, in electronic devices there is the risk that upon heating above a critical Temperature—possibly as a result of a malfunction in the device—the thermal energy provided on the device surface can also result in ignition of an explosive gas mixture surrounding the device.

Countermeasures known from the prior art therefore provide to arrange the electronic device in a pressure-tight casing which is intended to prevent reactive gases coming in contact with the device surface including the electronic or electrical interfaces present there. In such pressure-tight casings however it proves to be problematical that certain gas forms, as a result of the small size of the gas molecules or gas atoms, can also diffuse into casings designed to be pressure-tight and can there come in contact with the electronic device.

SUMMARY

It is therefore the object of the present invention to provide an improved embodiment of a device arrangement with an electronic device and a casing for this electronic device in which the aforesaid problem does not occur or only occurs in severely mitigated form.

This object is solved by the subject matter of the independent claims. Preferred embodiments are the subject matter of the dependent patent claims.

The basic idea of the invention is accordingly to divide a casing for receiving an electronic device by means of a resilient partition wall into a first and a second sub-chamber and to fill the first of the two sub-chambers which is adapted to receive the electronic device, with a gas which is at a predetermined gas pressure. In contrast the second sub-chamber of the casing is configured in such a manner that a fluid communication exists between it and the surroundings around the casing. Essential to the invention in this case is a pressurising device which applies an additional predetermined pressure to the first sub-chamber so that the overall gas pressure prevailing in the first sub-chamber is composed of the original predetermined gas pressure of the gas and said additional pressure. Compared with the second sub-chamber and the surroundings of the casing, a positive gas pressure is produced in the first sub-chamber which counteracts the undesired in-diffusion of gas atoms or gas molecules from outside into the second sub-chamber.

In the event that the ambient pressure around the casing now drops, possibly because the casing together with the electronic device is transported to a higher location, the gas pressure existing in the second sub-chamber will also decrease by the same amount; this is because as a result of the fluid communication existing between the second sub-chamber and the surroundings of the casing, the same gas pressure always prevails in the second sub-chamber as in the surroundings around the casing.

A pressure drip in the second sub-chamber therefore initially results in an increased pressure difference between the gas pressure in the first sub-chamber and the reduced gas pressure in the second sub-chamber. If the effect of the pressurising device essential to the invention were completely disregarded, said pressure difference would result in a movement of the resilient partition wall away from the first sub-chamber towards the second sub-chamber so that the volume of the first sub-chamber is increased by the movement of the partition wall until as a result of the reduction of the gas pressure in the first sub-chamber accompanying the increase in volume of the first sub-chamber, a pressure equilibrium again prevails in both sub-chambers.

In this stationary end state the gas pressure in the first sub-chamber would precisely correspond to that in the second sub-chamber. By means of the pressurising device essential to the invention however—regardless of the gas pressures prevailing in the two sub-chambers and produced by the gases located therein—an additional force is applied to the partition wall towards the first sub-chamber. This means that the new equilibrium position of the partition wall is shifted by a predetermined amount towards the second sub-chamber taking into account the additional pressure generated by the pressurising device compared to that at which the pressure additionally generated by the pressurising device remains disregarded. However, the associated reduction in volume of the first sub-chamber leads to a pressure rise in the first sub-chamber. The amount of this pressure rise exactly corresponds to the additional fluid pressure produced by the pressurising device.

Consequently, in the new equilibrium state the gas pressure in the first sub-chamber in which the first electronic device to be protected by means of the casing is provided, is always greater by a predetermined amount than the gas pressure in the second sub-chamber, which is always identical to the instantaneous ambient pressure. The pressurised first sub-chamber compared to the second sub-chamber and the surroundings of the casing largely prevents or even completely prevents the in-diffusion of explosive gas into the first sub-chamber. This enables a highly effective protection of the electronic device located in the first sub-chamber so that this can also be used in explosion-prone areas without there being a risk of an explosion being triggered by the device.

In a preferred embodiment the partition wall may particularly expediently be configured as a membrane which is impermeable to the gas. This ensures that the gas located in the first sub-chamber cannot pass through the membrane from the first into the second sub-chamber and via this through the existing fluid communication into the surroundings. At the same time, the configuration of the partition wall as a membrane gives this the desired elastic properties. As membrane material it is possible to consider possibly a metal or a plastic, in the latter case preferably an elastomer. In particular a rubber has particularly good elastic properties.

For the stable fastening of the electronic device in the first sub-chamber, at least one retaining element, preferably at least two retaining elements can be provided in said sub-chamber, on which the electronic device can be detachably or, alternatively to this, fixedly fastened. In the former case, such retaining elements can be configured approximately in the form of latching elements on which the electronic device can be detachably fixed. Alternatively to such latching connections, naturally other types of connection are also conceivable; for example, it is feasible to attach the electronic device by means of a clamping connection configured by the retaining elements in the first sub-chamber.

In order to produce the required fluid communication between the second sub-chamber and the instantaneous surroundings of the casing, according to an advantageous further development it is proposed to provide a through-opening in the casing which connects the second sub-chamber fluidically to the surroundings of the casing.

According to a further preferred embodiment which allows a particularly simple technical realization of the pressurising device, this comprises at least one spring element, preferably four spring elements. The spring element may in this case be supported at one end—directly or indirectly, in the latter case via another component installed in the casing—on the casing and at the other end on the partition wall. The spring element should be attached in this case in such a manner in the casing that it pre-tensions the partition wall whilst exerting a pre-tensioning force towards the first sub-chamber. The desired additional fluid pressure in the first sub-chamber can be produced by means of a pre-tensioning force produced in such a manner.

With regard to the arrangement of the pressurising device, various technical possibilities for realization open up to the relevant person skilled in the art. Thus, according to a first design the pressurising device may be disposed in the second sub-chamber. According to the scenario explained above which proposes the use of one or more spring elements, these are accordingly pre-tensioned under pressure.

In an alternative variant to this however, it is also conceivable to arrange the pressurising device in the first sub-chamber. If spring elements are also used in this variant, the desired pressurisation in the first sub-chamber can be produced by tensioning the spring elements to produce the desired pre-tensioning force.

The resilient properties required to produce a pre-tensioning force are also present in a multiplicity of modern materials. In particular deformable plastics such as possibly elastomers are recommended for use in the device presented here.

In order to be able to use the casing presented here also as a casing for a tablet computer with integrated display, it is proposed to provide a viewing window at a suitable place in the casing which is sealed by means of a window pane made of transparent material. With a suitable configuration of the viewing window known to the person skilled in the art—a sufficiently thin but mechanically stable configuration of the window pane by using a toughened glass as pane material may be considered—it can be ensured that the touchscreen functionality absolutely essential for a tablet computer is preserved.

An advantageous but spatially particularly compact design is obtained if said viewing window is provided in a first casing wall of the casing, which lies opposite a second casing wall in which the through opening for the fluidic communication of the second sub-chamber with the surroundings of the casing is provided.

In an advantageous further development, an inert gas such as, for example, argon can be used as gas with which the first sub-chamber is to be filled.

Particularly expediently the pressurising device may be configured in such a manner that the pressure difference caused by it between the gas pressures in the two sub-chambers of the casing is at least 2 millibar, preferably at least 4 millibar.

Further important features and advantages of the invention are obtained from the sub-claims, from the drawings and from the appurtenant description of the figures by reference to the drawings.

It is understood that the features specified hereinbefore and to be explained hereinafter can be used not only in the respectively given combination but also in other combinations or alone without departing from the framework of the present invention.

BRIEF DESCRIPTION OF THE DRAWINGS

Preferred exemplary embodiments of the invention are shown in the drawings and are explained in detail in the following description, where the same reference numbers relate to the same or similar or functionally the same components.

FIG. 1 illustrates a schematic longitudinal section of an exemplary device arrangement.

DETAILED DESCRIPTION

The single FIG. 1 shows in rough schematic view an example of a device 1 according to the invention. The device 1 has a sufficiently dimensioned casing 5 which encloses a casing interior 6.

A resilient partition wall 7 is attached in the casing interior 6 of the casing 5 and specifically in such a manner that it divides the casing interior 6 into a first sub-chamber 8a and a second sub-chamber 8b which is fluidically separated from this. In this case, the first sub-chamber 8a is adapted for receiving an electronic device 2. Consequently in the example scenario of FIG. 1 the first sub-chamber 8a receives an electronic device 2 in the form of a tablet computer 3 which has a display 4 with touchscreen functionality.

For stable fastening of the electronic device 1 in the first sub-chamber 8a, a plurality of retaining elements can be provided in the form of latching elements (not shown) on which the electronic device 2 can be detachably fastened. Alternatively to this a clamping connection (not shown) can also be considered. In general the formation of a fixed, i.e. non-detachable connection is also feasible. In the example in FIG. 1 the casing 5 has a first casing wall 5a in which a viewing window 13 is provided. This is sealed by a window pane 14 made of toughened glass. Through the viewing window 13 the display 4 remains visible for the user of the tablet computer 3 even in the state mounted in the casing 5 and can be used as a touchscreen.

The second sub-chamber 8b communicates fluidically with the surroundings U of the casing 5 with the aid of a through opening 10. It is clear that the surroundings U are not part of the device 1. This means that the gas pressure $p_2$ prevailing in the second sub-chamber is always identical to the gas pressure $p_U$ prevailing in the surroundings U since gas 9b from the surroundings U, typically air, can penetrate into the second sub-chamber 8b at any time via the through opening. A gas 9a at a pre-determined gas pressure $p_{gas}$, for example, argon, which surrounds the electronic device 2, is introduced into the first sub-chamber 8a on the other hand—this being fluidically isolated.

In the example scenario of FIG. 1 the partition wall 7 according to preferred embodiment is configured as a membrane 12 which is impermeable for argon gas 9a. This ensures that the gas 9a located in the first sub-chamber 8a cannot pass through the membrane 12 from the first into the second sub-chamber and pass via this through the through-opening 10 into the surroundings U. At the same time, the configuration of the partition wall 7 in the form of a membrane 12 gives this the desired elastic properties. For example, a metal or a plastic can be used as membrane material, in the latter case for example an elastomer. In particular rubber can be considered as an elastomer.

If the pressurising device 11 essential to the invention is initially disregarded in the following considerations, the gas pressure $p_{gas}$ corresponds to the pressure $p_1$ prevailing in the first sub-chamber 8a. In the event that the ambient pressure $p_U$ around the casing 5 drops, possibly because the casing 5 with the electronic device 2 is transported to a higher location, as a result of the existing fluid communication between the second sub-chamber 8b and the surroundings U of the casing 5, the pressure in the second sub-chamber 8b drops by the same amount; a pressure drop in the second sub-chamber 8b possibly results in a pressure difference between the gas pressure $p_1$ in the first sub-chamber 8a and the reduced gas pressure $p_2$ in the second sub-chamber 8b. If the effect of the pressurising device 11 is disregarded, said pressure difference would result in a movement of the resilient partition wall 7 away from the first sub-chamber 8a towards the second sub-chamber 8b so that the volume of the first sub-chamber 8a is increased by the movement of the partition wall 7 until as a result of the reduction in the gas pressure $p_1$ in the first sub-chamber accompanying the increase in volume of the first sub-chamber 8a, a pressure equilibrium of the two gas pressures $p_1$ and $p_2$ again prevails in both sub-chambers 8a, 8b. Such a scenario is shown in FIG. 1 by a partition wall having the reference number 7' shown by a dashed line. In this stationary end state the gas pressure $p_1$ in the first sub-chamber 8a would again correspond to the gas pressure $p_2$ in the second sub-chamber 8b.

Against this background a pressurising device 11 provided in the second sub-chamber 8b is now essential to the invention, by which means the fluid pressure $p_1$ prevailing in the first sub-chamber 8a is increased by a predetermined amount $p_D$ to a gas pressure $p_1'$ increased compared with the gas pressure $p_2$.

In the stationary state in which the resilient partition wall 7 remains free of movement in a stable equilibrium position, the relationship $$p_1' = p_2 + p_D,$$

therefore holds, i.e. the argon gas 9a in the first sub-chamber 9a is always at a pressure higher by the amount $p_D$ than the gas 9b in the second sub-chamber 9b and specifically independently of the ambient pressure pU prevailing in the second sub-chamber 8b.

The first sub-chamber 8a pressurised by the difference pressure $p_D$ compared to the second sub-chamber 8b and the surroundings U of the casing 5 then largely or even completely prevents the in-diffusion of explosive gases into the first sub-chamber 8a. This enables a highly effective protection of the electronic device 2 placed in the first sub-chamber 8a so that this can also be used in explosion-prone areas.

The pressurising device 11 can be configured in such a manner that the pressure difference brought about by it between the gas pressures p1, p2 in the two subchambers $8_1$, 8b of the casing 5 is at least 2 millibar, preferably at least 4 millibar.

For this purpose, the pressuring device 11 comprises spring elements 15 of which only two are shown as an example in FIG. 1. The two spring elements 15 are attached in the second sub-chamber 8b—in variants an alternative arrangement to this, for example, in the first sub-chamber 8a is naturally also conceivable—and are each supported at one end on a second casing wall 5b opposite the first casing wall 5a and at the other end on the resilient partition wall 7. For example, deformable plastics—possibly elastomers can be considered—can be used for use as spring elements 15.

The invention claimed is:

1. A device for receiving an electronic device, comprising:
a casing enclosing at least partially a casing interior,
a resilient partition wall disposed in the casing dividing the casing interior into a first sub-chamber and a second sub-chamber fluidically separated from the first sub-chamber, wherein the first sub-chamber is configured to receive the electronic device,
the first sub-chamber including a first gas at a pre-determined gas pressure and the second sub-chamber including a second gas having a second gas pressure,
a pressurising device disposed in the casing interior, wherein the pressurising device is configured to increase the pre-determined gas pressure of the first sub-chamber by a pre-determined amount in relation to the second gas pressure in the second sub-chamber,
wherein the second sub-chamber communicates fluidically with a surroundings environment of the casing.

2. The device according to claim 1, wherein the partition wall includes an impermeable membrane for at least the first gas.

3. The device according to claim 2, wherein the membrane is composed of an impermeable membrane material for at least the first gas, the membrane material including at least one of a metal, a plastic and an elastomer.

4. The device according to claim 1, further comprising at least one retaining element disposed in the first sub-chamber, the at least one retaining element configured to detachably secure the electronic device.

5. The device according to claim 1, wherein the casing includes a through opening which fluidically connects the second sub-chamber to the surrounding environment.

6. The device according to claim 1, wherein the pressurising device includes at least one spring element having at least two opposing ends, the at least one spring element supported at one end on the casing and at the other end on the partition wall.

7. The device according to claim 1, wherein the pressurising device is disposed in at least one of the first sub-chamber and the second sub-chamber.

8. The device according to claim 6, wherein the at least one spring element is composed of an elastomer.

9. The device according to claim 1, further comprising a viewing window defined by the casing, wherein the viewing window is sealed by a window pane composed of a transparent material.

10. The device according to claim 5, wherein the casing includes a first casing wall disposed opposite a second casing wall, wherein the first casing wall defines a viewing window and the second casing wall includes the through opening for fluidic communication of the second sub-chamber with the surrounding environment.

11. The device according to claim 1, wherein the first gas includes argon.

12. The device according to claim 1, wherein the pressurising device induces a pressure difference between the first sub-chamber and the second sub-chamber of at least 2 millibar.

13. The device according to claim 1, wherein the casing includes a first casing wall opposite a second casing wall, wherein the first casing wall defines a viewing window sealed via a window pane composed of a transparent material.

14. The device according to claim 2, wherein the pressurising device includes at least one spring element disposed in the second sub-chamber, the at least one spring element having at least two opposing ends, wherein the spring element is supported at one end on the casing and at the other end on the impermeable membrane of the partition wall.

15. The device according to claim 14, wherein the casing includes a through opening which fluidically connects the second sub-chamber to the surrounding environment.

16. The device according to claim 2, further comprising at least one retaining element disposed at the first sub-chamber, the at least one retaining element configured to detachably secure the electronic device.

17. The device according to claim 3, wherein the casing includes a through opening which fluidically connects the second sub-chamber to the surrounding environment.

18. The device according to claim 17, wherein the first gas includes argon.

19. The device according to claim 17, wherein the pressurising device includes at least one spring element disposed in the second sub-chamber, the at least one spring element having at least two opposing ends, wherein the spring element is supported at one end on the casing and at the other end on the impermeable membrane of the partition wall.

20. A device arrangement for an explosive prone environment, comprising:
- a casing at least partially enclosing a casing interior, the casing including a first casing wall and a second casing wall opposite the first casing wall, wherein the first casing wall defines a viewing window and the second casing wall includes a through opening;
- a resilient partition wall disposed in the casing composed of a gas impermeable membrane, the partition wall separating the casing interior into a first sub-chamber fluidically separated from a second sub-chamber, wherein the first sub-chamber is configured to receive an electronic device;
- the first sub-chamber including a first gas having a first gas pressure and the second sub-chamber including a second gas having a second gas pressure;
- a pressurising device disposed in the casing interior, the pressurising device configured to change the first gas pressure in the first sub-chamber a predetermined amount in relation to the second gas pressure in the second sub-chamber;
- wherein the second sub-chamber communicates fluidically with a surrounding environment of the casing via the through opening.

* * * * *